US011735686B2

(12) United States Patent
Inoue et al.

(10) Patent No.: US 11,735,686 B2
(45) Date of Patent: Aug. 22, 2023

(54) METHOD FOR MANUFACTURING LIGHT-EMITTING ELEMENT

(71) Applicant: NICHIA CORPORATION, Anan (JP)

(72) Inventors: Yoshiki Inoue, Anan (JP); Shun Kitahama, Tokushima (JP); Yoshiyuki Aihara, Tokushima (JP); Yoshiki Matsushita, Tokushima (JP); Keisuke Higashitani, Tokushima (JP)

(73) Assignee: NICHIA CORPORATION, Anan (JP)

( * ) Notice: Subject to any disclaimer, the term of this patent is extended or adjusted under 35 U.S.C. 154(b) by 72 days.

(21) Appl. No.: 17/113,583

(22) Filed: Dec. 7, 2020

(65) Prior Publication Data

US 2021/0193867 A1 Jun. 24, 2021

(30) Foreign Application Priority Data

Dec. 23, 2019 (JP) ................. 2019-231153

(51) Int. Cl.
*H01L 33/00* (2010.01)
*H01L 33/50* (2010.01)
*H01L 33/22* (2010.01)

(52) U.S. Cl.
CPC ........ *H01L 33/0095* (2013.01); *H01L 33/007* (2013.01); *H01L 33/22* (2013.01); *H01L 33/507* (2013.01); *H01L 2933/0041* (2013.01)

(58) Field of Classification Search
CPC .................................................. H01L 33/007
USPC ........................................................ 438/29
See application file for complete search history.

(56) References Cited

U.S. PATENT DOCUMENTS

| 2011/0062479 | A1 | 3/2011 | Sugano et al. |
| 2011/0275172 | A1 | 11/2011 | Okabe |
| 2013/0140592 | A1* | 6/2013 | Lee ................. H01L 33/22 |
| | | | 257/E33.062 |
| 2014/0110744 | A1 | 4/2014 | Wang et al. |
| 2015/0118775 | A1 | 4/2015 | Narita et al. |
| 2017/0108173 | A1 | 4/2017 | Kim et al. |
| 2017/0278834 | A1 | 9/2017 | Tanaka et al. |
| 2019/0027662 | A1 | 1/2019 | Saputra et al. |

(Continued)

FOREIGN PATENT DOCUMENTS

| JP | 2009-111102 A | 5/2009 |
| JP | 2011-129765 A | 6/2011 |
| JP | 2013-051298 A | 3/2013 |

(Continued)

*Primary Examiner* — Hsin Yi Hsieh
(74) *Attorney, Agent, or Firm* — Foley & Lardner LLP

(57) ABSTRACT

A method for manufacturing a light-emitting element includes dividing a semiconductor structure into a plurality of light-emitting portions by removing a portion of the semiconductor structure so as to form an exposed region, a first surface being exposed from under the semiconductor structure in the exposed region; etching protrusions formed in the exposed region; bonding a light-transmitting body to a second surface so as to form a bonded body; forming a plurality of modified regions along the exposed region inside the substrate by irradiating a laser beam on the exposed region from the first surface side; removing a portion of the light-transmitting body that overlaps the plurality of modified regions in a plan view; and singulating the bonded body along the modified regions.

14 Claims, 12 Drawing Sheets

(56) References Cited

U.S. PATENT DOCUMENTS

2019/0067519 A1 2/2019 Niwa et al.

FOREIGN PATENT DOCUMENTS

| JP | 2013-098298 A | 5/2013 |
| JP | 2014-103238 A | 6/2014 |
| JP | 5556657 B | 7/2014 |
| JP | 2015-088532 A | 5/2015 |
| JP | 2017-174909 A | 9/2017 |
| JP | 2019-040980 A | 3/2019 |
| JP | 2019-514194 A | 5/2019 |
| WO | WO-2009/139376 A1 | 11/2009 |

* cited by examiner

METHOD FOR MANUFACTURING LIGHT-EMITTING ELEMENT

CROSS-REFERENCE TO RELATED APPLICATION

This application claims priority to Japanese Patent Application No. 2019-231153, filed on Dec. 23, 2019, the disclosure of which is hereby incorporated by reference in its entirety.

BACKGROUND

The present disclosure relates to a method for manufacturing a light-emitting element.

Japanese Patent No. 5556657 discusses a method for dicing a wafer in which a semiconductor structure including a light-emitting layer is formed on a substrate, in which modified regions are formed by concentrating a laser beam in the substrate interior, and the wafer is cleaved by using cracks extending from the modified regions as starting points. Also, there is a method in which a semiconductor structure including a light-emitting layer is grown on a surface of a substrate including multiple protrusions.

SUMMARY

When collectively cleaving a substrate and a light-transmitting body including a fluorescer after the light-transmitting body is bonded to the back surface of the substrate, it is difficult to concentrate a laser beam inside the substrate via the light-transmitting body from the backside of the substrate. Therefore, it is necessary to form modified regions inside the substrate by irradiating the laser beam from the front side of the substrate in which multiple protrusions are formed. However, in such a case, the laser beam is scattered by the multiple protrusions, and there is a risk that it may be difficult to form the modified regions inside the substrate.

The present disclosure is directed to a method for manufacturing a light-emitting element in which modified regions can be formed by efficiently concentrating a laser beam inside a substrate including multiple protrusions, so that a bonded body, which includes the substrate and a light-transmitting body including a fluorescer, can be singulated along the modified regions.

According to one embodiment of the present disclosure, a method for manufacturing a light-emitting element includes forming a semiconductor structure including a light-emitting layer on a first surface of a substrate, the substrate including the first surface and a second surface at a side opposite to the first surface, the first surface including a plurality of protrusions; dividing the semiconductor structure into a plurality of light-emitting portions by forming an exposed region by removing a portion of the semiconductor structure, the first surface being exposed from under the semiconductor structure in the exposed region; etching the protrusions formed in the exposed region; forming a bonded body by bonding the substrate and a light-transmitting body by bonding the light-transmitting body to the second surface, the light-transmitting body including a fluorescer; forming a plurality of modified regions along the exposed region inside the substrate by irradiating a laser beam on the exposed region from the first surface side after the bonding of the light-transmitting body to the second surface; removing the light-transmitting body that overlaps a portion in which the plurality of modified regions is formed in a plan view after the forming of the plurality of modified regions; and singulating the bonded body along the modified regions.

According to another embodiment of the present disclosure, a method for manufacturing a light-emitting element includes forming a semiconductor structure including a light-emitting layer on a first surface of a substrate, the substrate including the first surface and a second surface at a side opposite to the first surface, the first surface including a first region and a second region, the first region including a plurality of protrusions, a surface of the second region having a smaller arithmetic average roughness than a surface of the first region; dividing the semiconductor structure into a plurality of light-emitting portions by forming an exposed region by removing a portion of the semiconductor structure, the second region being exposed from under the semiconductor structure in the exposed region; forming a bonded body by bonding the substrate and a light-transmitting body by bonding the light-transmitting body to the second surface, the light-transmitting body including a fluorescer; forming a plurality of modified regions along the exposed region inside the substrate by irradiating a laser beam on the exposed region from the first surface side after the bonding of the light-transmitting body to the second surface; removing the light-transmitting body that overlaps a portion in which the plurality of modified regions is formed in a plan view after the forming of the plurality of modified regions; and singulating the bonded body along the modified regions.

According to certain embodiments of the method for manufacturing the light-emitting element of the present disclosure, the modified regions can be formed by efficiently concentrating the laser beam inside the substrate including the multiple protrusions, so that the bonded body, which includes the substrate and the light-transmitting body including the fluorescer, can be singulated along the modified regions.

BRIEF DESCRIPTION OF THE DRAWINGS

FIG. 5B to FIG. 6B are schematic cross-sectional views showing the method for manufacturing the light-emitting element according to one embodiment of the invention;

DETAILED DESCRIPTION

Figure 1A:
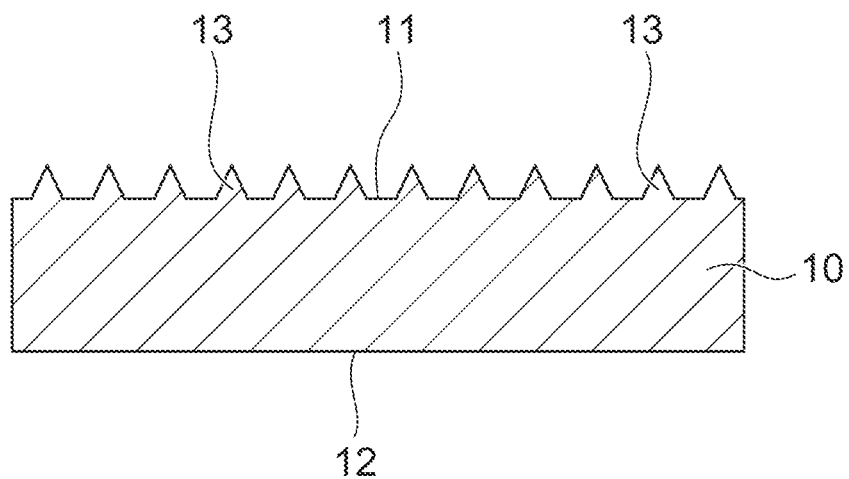
FIG. 1A to FIG. 4B are schematic cross-sectional views showing a method for manufacturing a light-emitting element according to one embodiment of the invention.

Embodiments will now be described with reference to the drawings. The same components in the drawings are labeled with the same reference numerals.

A method for manufacturing a light-emitting element of one embodiment of the invention will now be described with reference to FIGS. 1A to 7B.

As shown in FIG. 1A, a substrate 10 includes a first surface 11, and a second surface 12 at a side opposite to the first surface 11. Multiple protrusions 13 are formed in the first surface 11. The protrusions 13 may be, for example, circular conic or truncated circular conic.

Figure 1B:
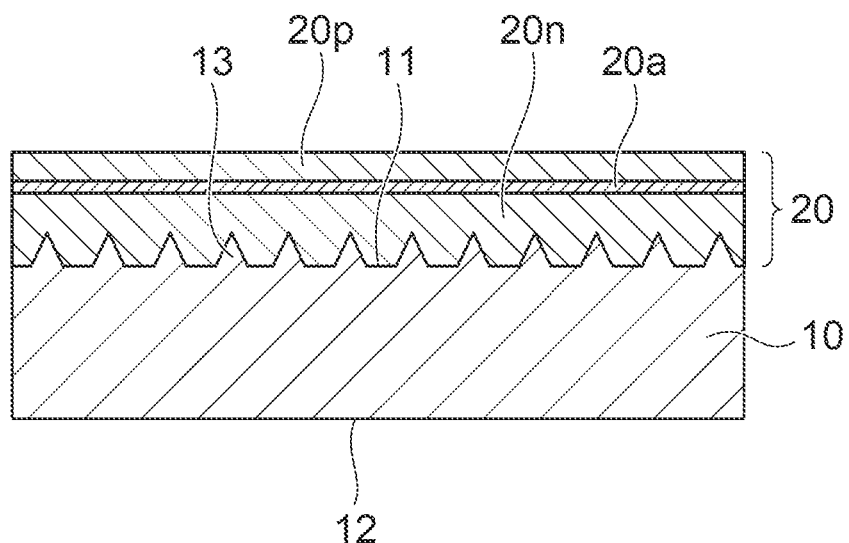

As shown in FIG. 1B, a semiconductor structure 20 that includes a light-emitting layer 20a is formed on the first surface 11 of the substrate 10 in which the multiple protrusions 13 are formed. For example, the semiconductor structure 20 is epitaxially grown on the first surface 11 of the substrate 10 by MOCVD (metal organic chemical vapor deposition). The thickness of the semiconductor structure 20 is, for example, not less than 5 μm and not more than 15 μm.

The substrate 10 is light-transmitting to light emitted by the light-emitting layer 20a. The substrate 10 is, for example, a sapphire substrate. The first surface 11 is, for example, a c-plane of the sapphire. The first surface 11 may be tilted from the c-plane in a range in which the semiconductor structure 20 can be formed with good crystallinity. The dislocation density of the semiconductor structure 20 can be reduced by forming the semiconductor structure 20 on the first surface 11 in which the multiple protrusions 13 are provided. Also, by providing the multiple protrusions 13, the light that is emitted by the light-emitting layer 20a can easily enter through the first surface 11.

For example, the semiconductor structure 20 is formed of a nitride semiconductor layer including gallium. For example, GaN, InGaN, AlGaN, etc., are examples of the nitride semiconductor layer including gallium. In the specification, "nitride semiconductor" includes all compositions of semiconductors of the chemical formula $In_xAl_yGa_{1-x-y}N$ ($0 \leq x \leq 1$, $0 \leq y \leq 1$, and $x+y \leq 1$) for which the composition ratio x and y are changed within the ranges respectively. As shown in FIG. 1B, the semiconductor structure 20 includes an n-side semiconductor layer 20n and a p-side semiconductor layer 20p. As shown in FIG. 7B, an n-electrode 21n that conducts to the n-side semiconductor layer 20n is formed, a p-electrode 21p that conducts to the p-side semiconductor layer 20p is formed, and the light-emitting layer 20a is caused to emit light by applying a voltage between the n-electrode 21n and the p-electrode 21p. For example, the p-electrode 21p that is provided at the upper surface of the p-side semiconductor layer 20p includes a metal material such as silver, aluminum, etc., that has a high reflectance to the light from the light-emitting layer 20a.

For example, the light-emitting layer 20a has a multi-quantum well structure that includes multiple well layers and multiple barrier layers. The peak wavelength of the light emitted by the light-emitting layer 20a is, for example, not less than 360 nm and not more than 650 nm.

Figure 2A:
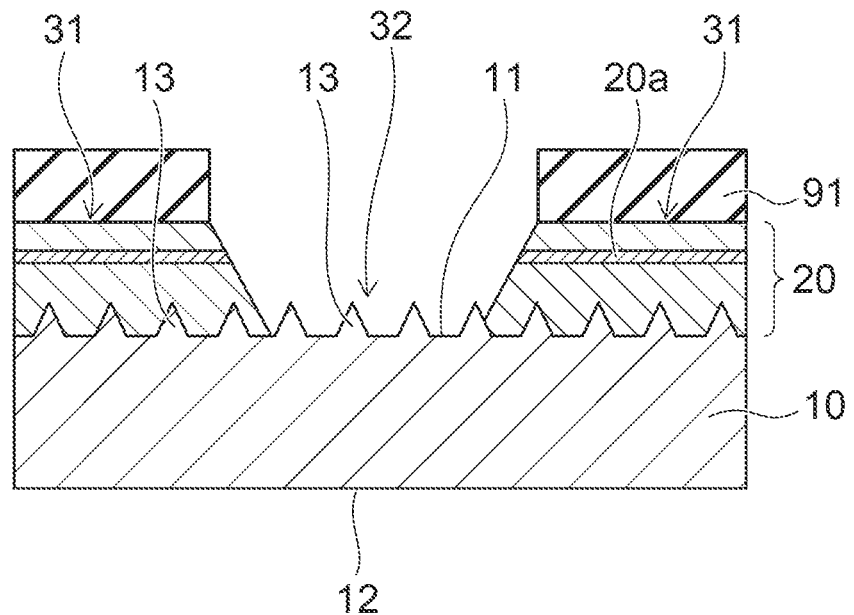

After forming the semiconductor structure 20 on the substrate 10, a portion of the semiconductor structure 20 is removed as shown in FIG. 2A. After forming a mask 91 on the upper surface of the semiconductor structure 20, a portion of the semiconductor structure 20, which is a nitride semiconductor layer including gallium, is etched in the thickness direction. The mask 91 includes, for example, a resist film formed by photolithography. The removal of the semiconductor structure 20 includes, for example, dry etching using a $SiCl_4$ gas.

As shown in FIG. 2A, the portion of the semiconductor structure 20 that is not covered with the mask 91 is removed, and an exposed region 32 is formed in which the first surface 11 of the substrate 10 is exposed from under the semiconductor structure 20.

Figure 3A:
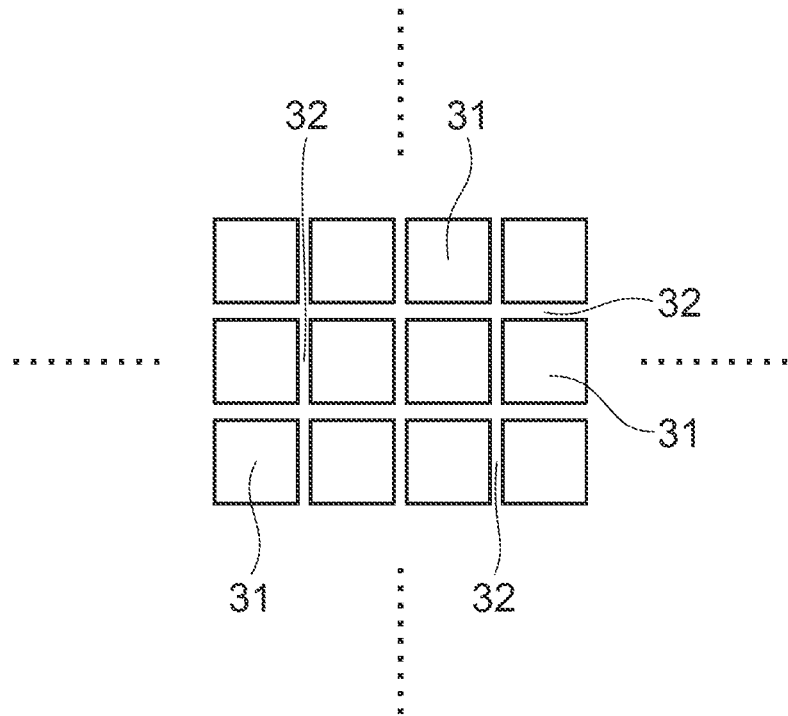

Multiple exposed regions 32 are formed in a mutually-orthogonal street configuration in a plane parallel to the first surface 11. As shown in FIG. 3A, the multiple exposed regions 32 divide the semiconductor structure 20 into multiple light-emitting portions 31. The width of the exposed region 32 is, for example, not less than 10 μm and not more than 100 μm.

The protrusions 13 that are formed in the first surface 11 are exposed in the exposed region 32. The protrusions 13 that are exposed in the exposed region 32 are etched. The etching of the protrusions 13 exposed in the exposed region 32 is performed using the same mask 91 as the formation of the exposed region 32 as-is, or by etching in a state in which the light-emitting portion 31 is covered by re-forming another mask. For example, the protrusions 13 that are exposed in the exposed region 32 are removed by dry etching using a $BCl_3$ gas.

Figure 2B:
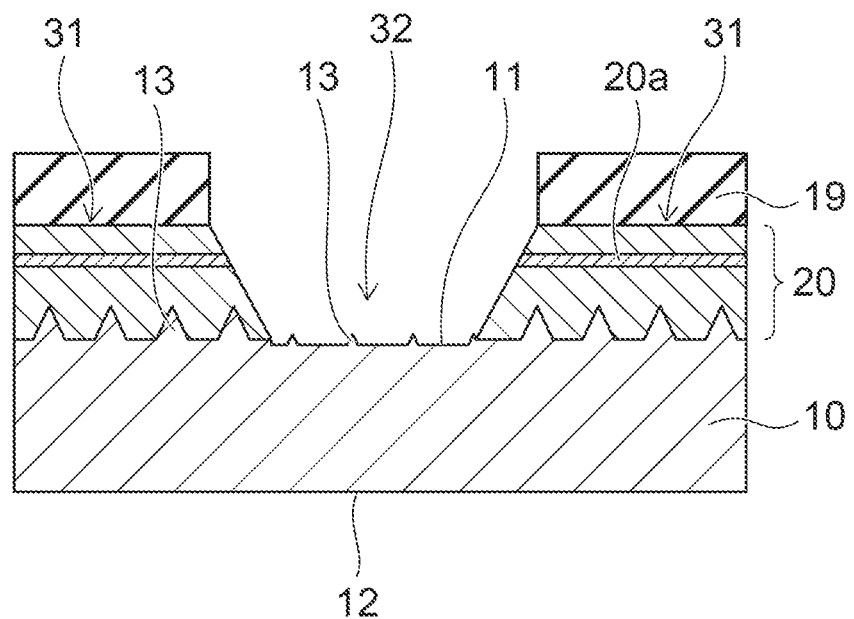

As shown in FIG. 2B, the protrusions 13 that are exposed in the exposed region 32 are etched, and the heights of the protrusions 13 become less than the heights of the protrusions 13 that are not etched. Also, the spacing between two adjacent protrusions 13 becomes greater than the spacing of two adjacent protrusions 13 that are not etched. For example, the heights of the protrusions 13 before the etching shown in FIG. 2A are not less than about 1 μm and not more than about 2 μm, and the heights of the protrusions 13 after the etching shown in FIG. 2B are not less than about 0.1 μm and not more than about 0.5 μm. Or, the protrusions 13 may be completely consumed by the etching. Thereby, the arithmetic average roughness of the first surface 11 in the exposed region 32 is less than the arithmetic average roughness of the first surface 11 in the region in which the light-emitting portion 31 is formed.

Also, not only the protrusions 13 but also the first surface 11 in the exposed region 32 is etched, and the first surface 11 in the exposed region 32 recedes further toward the second surface 12 side than the first surface 11 in the region in which the light-emitting portion 31 is formed. Accordingly, a level difference is formed between the first surface 11 in the region in which the light-emitting portion 31 is formed and the first surface 11 in the exposed region 32.

Figure 3B:
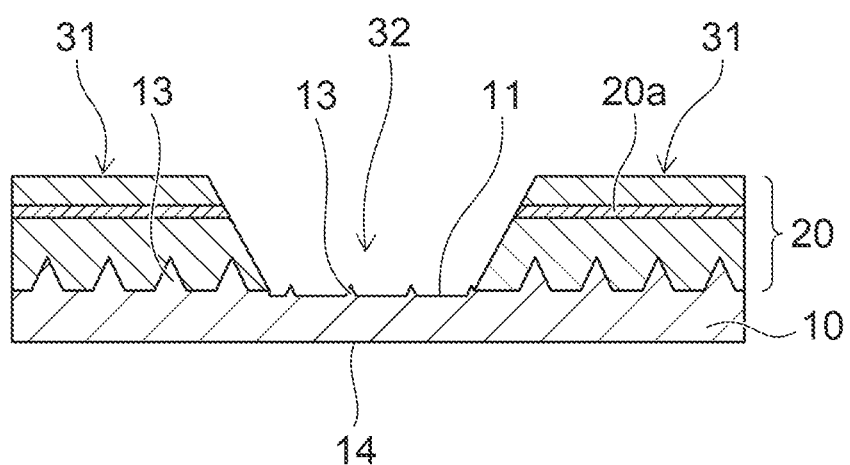

After etching the exposed region 32, the substrate 10 is thinned from the second surface 12 side as shown in FIG. 3B. For example, a third surface 14 is formed by thinning the substrate 10 from a second surface side by CMP (Chemical Mechanical Polishing) and by mirror polishing. For example, the thickness of the substrate 10 that was about 200 μm before thinning is reduced to 50 μm or less.

By singulating into the multiple light-emitting portions 31 on the substrate 10 by removing a portion of the semiconductor structure 20 before thinning the substrate 10, the stress of the semiconductor structure 20 on the substrate 10 can be relaxed, and warpage of the wafer made of the substrate 10 and the semiconductor structure 20 can be suppressed.

After thinning the substrate 10, a bonded body 50 in which the substrate 10 and a light-transmitting body 40 are bonded is formed by bonding the light-transmitting body 40 to the third surface 14 of the substrate 10 as shown in FIG.

4A. The light-transmitting body 40 is directly bonded to the third surface 14 that has been mirror-polished. The method for bonding the light-transmitting body 40 to the bonded body 50 includes, for example, surface-activated bonding.

The light-transmitting body 40 includes a fluorescer. The fluorescer is excited by the light emitted by the light-emitting layer 20a and emits light of a different wavelength from the wavelength of the light emitted by the light-emitting layer 20a. The light-transmitting body 40 includes a fluorescer in, for example, glass or a resin such as a silicone resin, etc. The light-transmitting body 40 may be a sintered body including a fluorescer. The fluorescer includes, for example, a cerium-activated yttrium-aluminum-garnet-based fluorescer (YAG:Ce), a cerium-activated lutetium-aluminum-garnet-based fluorescer (LAG:Ce), etc. The thickness of the light-transmitting body 40 is thicker than the substrate 10 and greater than the total thickness of the substrate 10 and the semiconductor structure 20. The thickness of the light-transmitting body 40 is, for example, not less than 70 μm and not more than 120 μm.

Figure 4A:
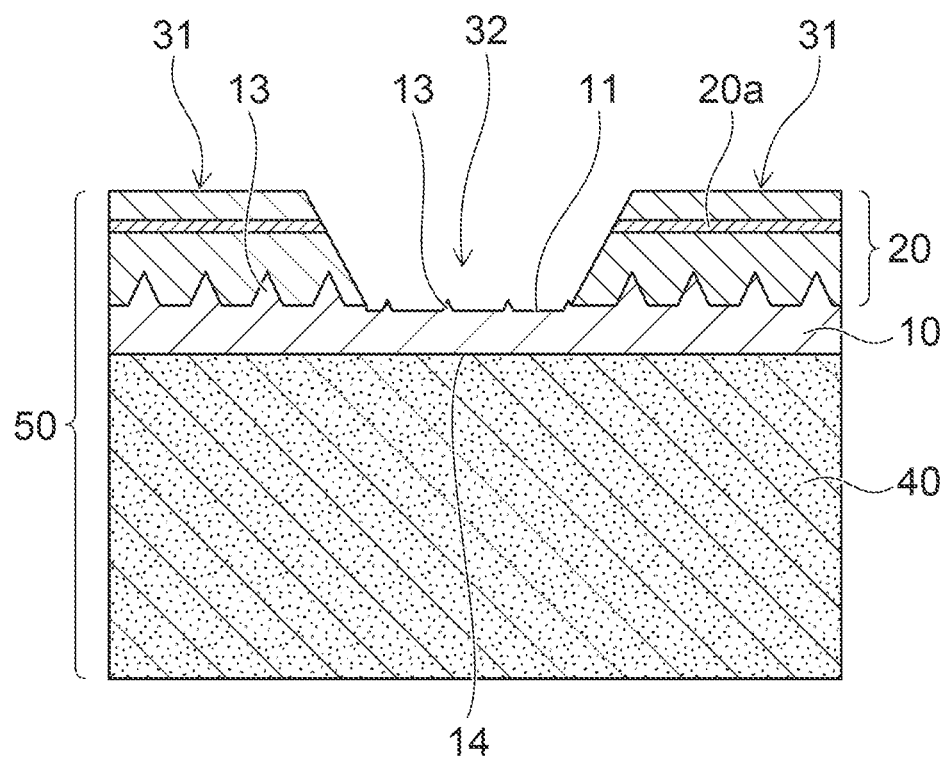
Figure 4B:
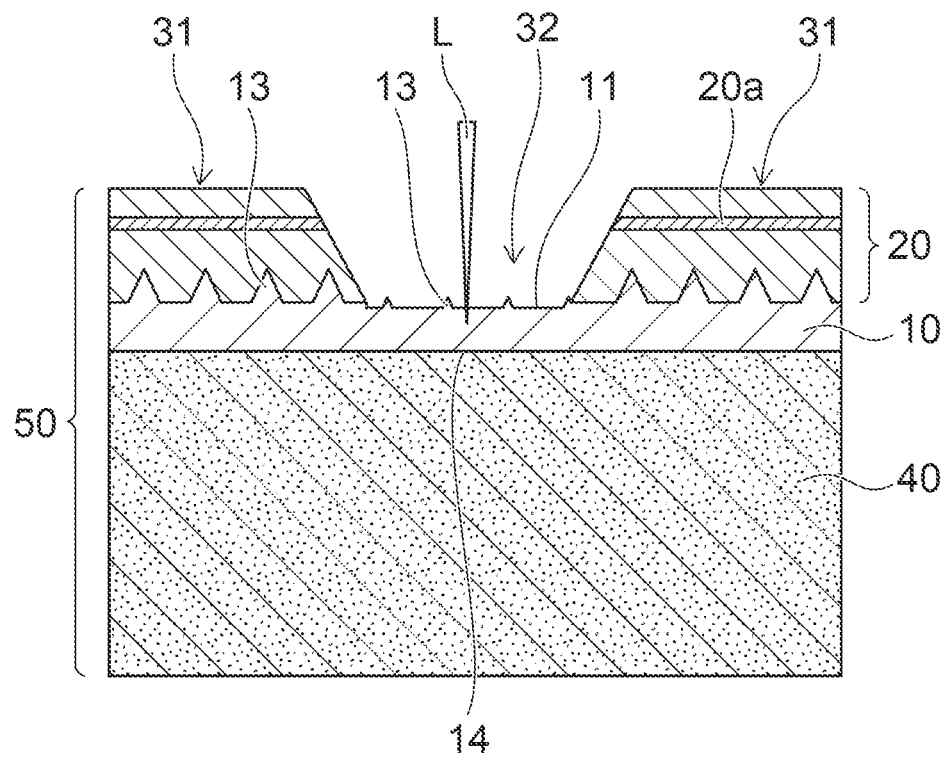

After forming the bonded body 50 in which the substrate 10 and the light-transmitting body 40 are bonded, a laser beam L is irradiated on the substrate 10 of the exposed region 32 from the first surface 11 side as shown in FIG. 4B. By bonding the light-transmitting body 40 to the substrate 10, the substrate 10 is supported by the light-transmitting body 40; in this state, the irradiation of the laser beam on the substrate 10 can be stably performed. The strength easily becomes insufficient in the process of thinning the substrate 10, and it is favorable to increase the strength by bonding the light-transmitting body 40 to the substrate 10.

The laser beam is emitted in pulses. For example, a Nd:YAG laser, a titanium sapphire laser, a Nd:YVO$_4$ laser, a Nd:YLF laser, or the like is used as the laser light source. The wavelength of the laser beam is the wavelength of the light passing through the substrate 10. For example, the laser beam has a peak wavelength in the range not less than 800 nm and not more than 1200 nm.

Figure 5A:
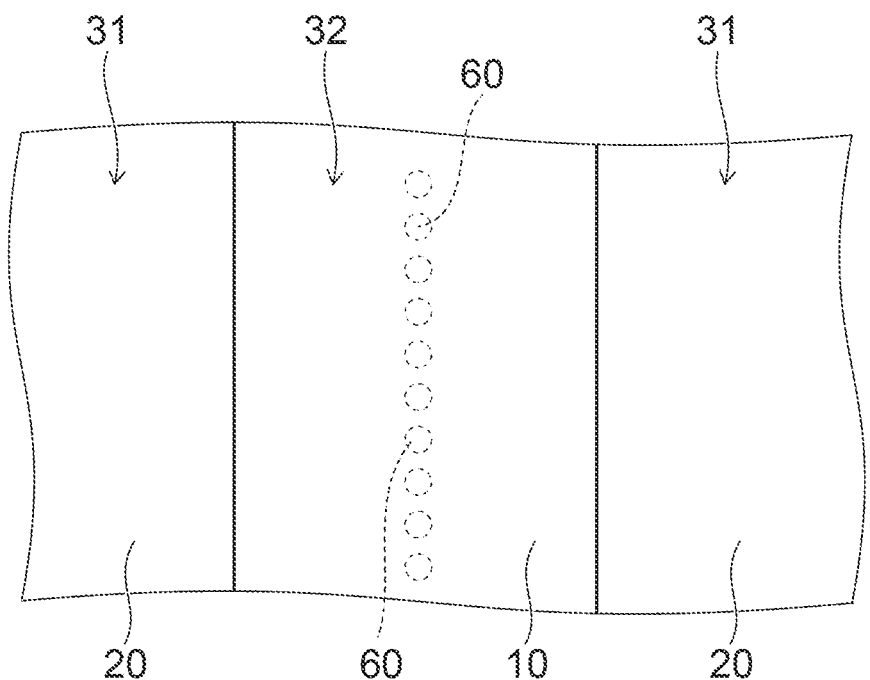
FIG. 5A is a schematic plan view showing the method for manufacturing the light-emitting element according to one embodiment of the invention.
Figure 5B:
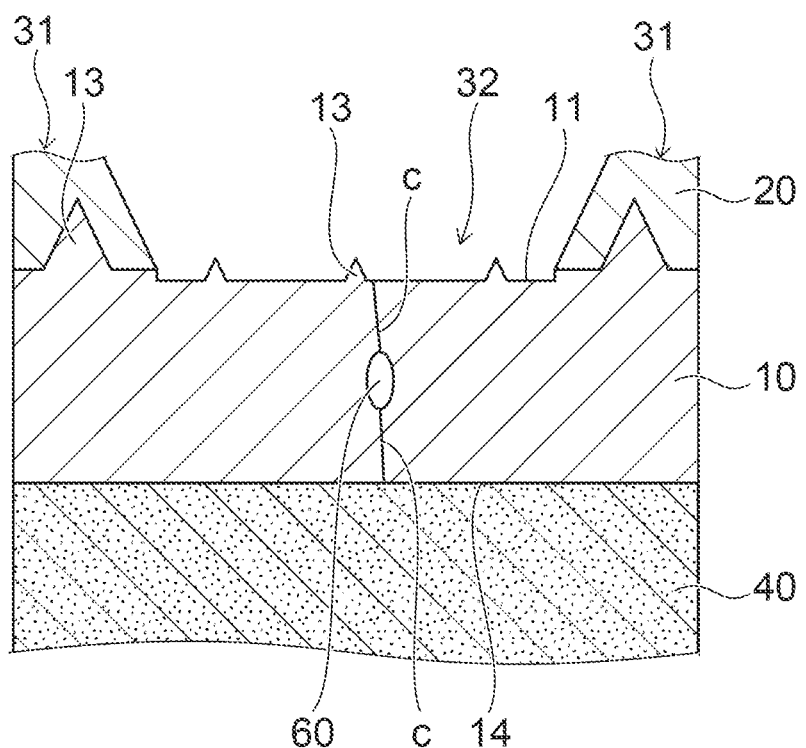

FIG. 5A is an enlarged schematic top view of the portion in which the laser beam is irradiated. FIG. 5B is a schematic enlarged cross-sectional view of the portion in which the laser beam is irradiated.

The laser beam is concentrated at a position at a designated depth inside the substrate 10; the energy of the laser beam concentrates at the position, and modified regions 60 are formed inside the substrate 10 as shown in FIG. 5B. The modified regions 60 are more embrittled than the portion of the substrate 10 where the laser beam is not concentrated.

The laser beam is scanned along the direction in which the exposed region 32 extends, and the multiple modified regions 60 are formed along the direction in which the exposed region 32 extends as shown in FIG. 5A. The multiple modified regions 60 may be separated from each other along the direction in which the exposed region 32 extends or may partially overlap each other.

The modified regions 60 that are formed by the irradiation of the laser beam generate stress, and the stress causes cracks to occur inside the substrate 10. As shown in FIG. 5B, a crack c occurs in the thickness direction of the substrate 10 from the modified region 60, and reaches the first surface 11 and the third surface 14. The crack c reaches the light-transmitting body 40 that is bonded to the third surface 14.

The modified regions 60 may be formed at positions of different depths inside the substrate 10. For example, multiple first modified regions 60 may be formed along the direction in which the exposed region 32 extends at a first depth, and multiple second modified regions 60 may be formed along the direction in which the exposed region 32 extends at a second depth that is different from the first depth. In such a case, the multiple first modified regions 60 and the multiple second modified regions 60 are formed to overlap in a plan view.

According to the embodiment, the heights of the protrusions 13 in the exposed region 32 on which the laser beam is irradiated are less than the heights of the protrusions 13 in the region in which the light-emitting portion 31 is formed, or the protrusions 13 in the exposed region 32 on which the laser beam is irradiated are consumed. In other words, the arithmetic average roughness of the first surface 11 in the exposed region 32 is less than the arithmetic average roughness of the first surface 11 in the region in which the light-emitting portion 31 is formed. Therefore, when irradiating the laser beam from the first surface 11 side, the scattering of the laser beam by the protrusions 13 is suppressed, and the modified regions 60 can be formed inside the substrate 10 by efficiently concentrating the laser beam. If the laser beam is irradiated from the third surface 14 side, it is necessary to concentrate the laser beam inside the substrate 10 via the light-transmitting body 40. However, because the fluorescer, etc., are included in the light-transmitting body 40, the laser beam is scattered by the fluorescer and cannot be easily concentrated inside the substrate 10.

Figure 6A:
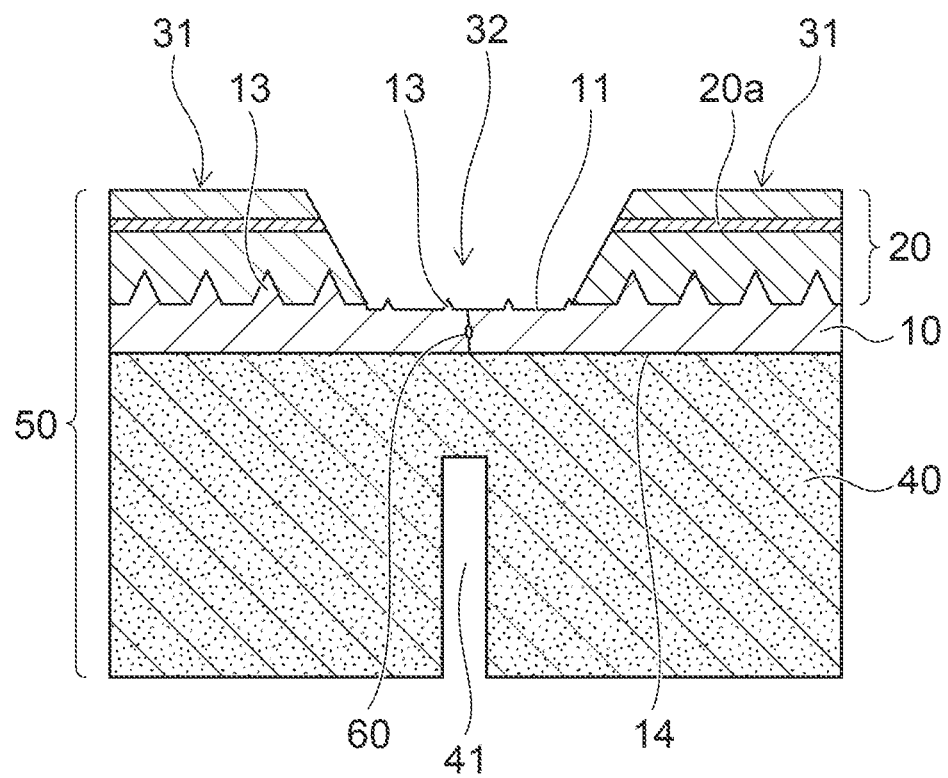

After forming the multiple modified regions 60 inside the substrate 10, a trench 41 is formed in the light-transmitting body 40 as shown in FIG. 6A. The trench 41 is formed in the light-transmitting body 40 from the surface on the side opposite to the bonding surface with the substrate 10. For example, the trench 41 is formed by blade dicing, etc.

The trench 41 is formed by removing a portion of the light-transmitting body 40 that overlaps the portion in which the multiple modified regions 60 are formed in a plan view. The trench 41 is formed along the multiple modified regions 60. The trench 41 may reach the substrate 10. It is favorable to form the trench 41 not to reach the substrate 10. For example, damage of the substrate 10 that may occur when the trench 41 is formed to reach the substrate 10 by blade dicing is suppressed thereby. The thickness of the light-transmitting body 40 that remains between the trench 41 and the substrate 10 is, for example, not less than 20 μm and 50 μm. For example, when the thickness of the light-transmitting body 40 is about 180 μm, about 30 μm of the light-transmitting body 40 will remain between the trench 41 and the substrate 10. The width of the trench 41 is, for example, not less than 30 μm and not more than 60 μm. Because the trench 41 is formed after the irradiation process of the laser beam described above, breakage of the light-transmitting body 40 of the irradiation process of the laser beam can be inhibited.

Figure 6B:
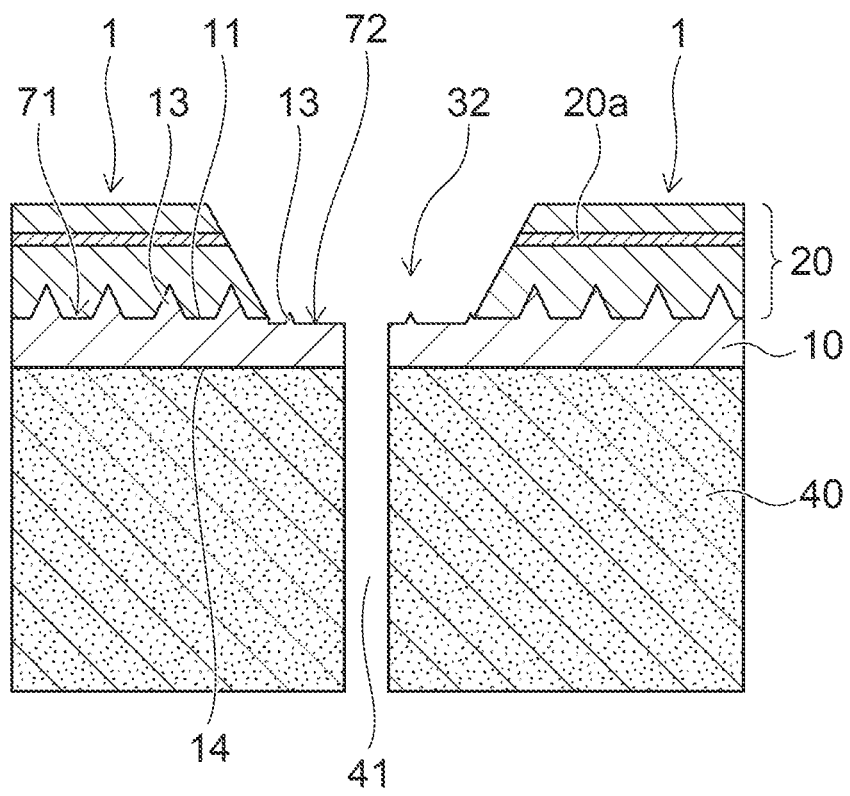

After forming the trench 41 in the light-transmitting body 40, for example, a force is applied to the bonded body 50 by using a pressing member, and the bonded body 50 is singulated along the trench 41 and the modified regions 60 as shown in FIG. 6B. When singulating the bonded body 50, the substrate 10 and the light-transmitting body 40 are collectively cleaved. For example, if the modified regions 60 are not formed inside the substrate 10 and a crack is not produced in the substrate 10, singulation is difficult even when a force is applied to the bonded body 50. Even if the bonded body 50 can be singulated, there is a risk that the substrate 10 may break in an unintended direction, and the yield can be reduced due to chipping of the substrate 10, etc. By presetting the substrate 10 to be thin, e.g., 50 μm thick or less, the substrate 10 can be singulated while further suppressing the chipping of the substrate 10.

Figure 7A:
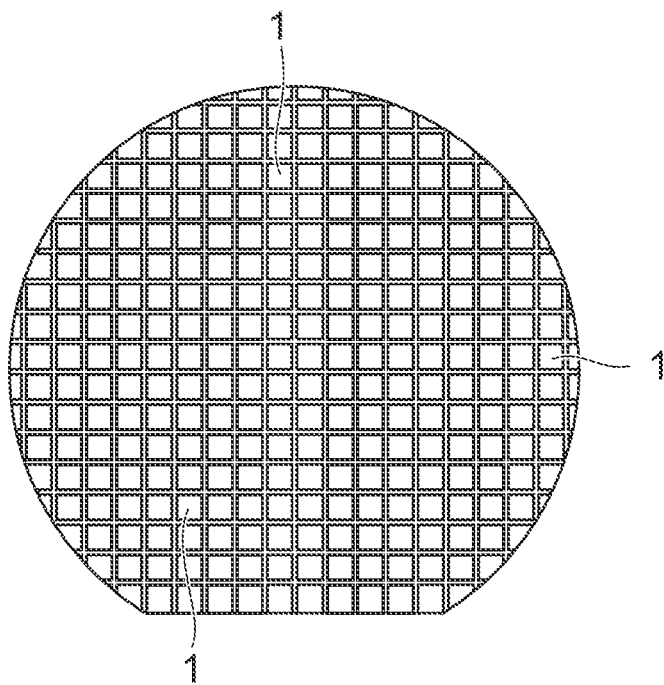
FIG. 7A is a schematic plan view showing the method for manufacturing the light-emitting element according to one embodiment of the invention.
Figure 7B:
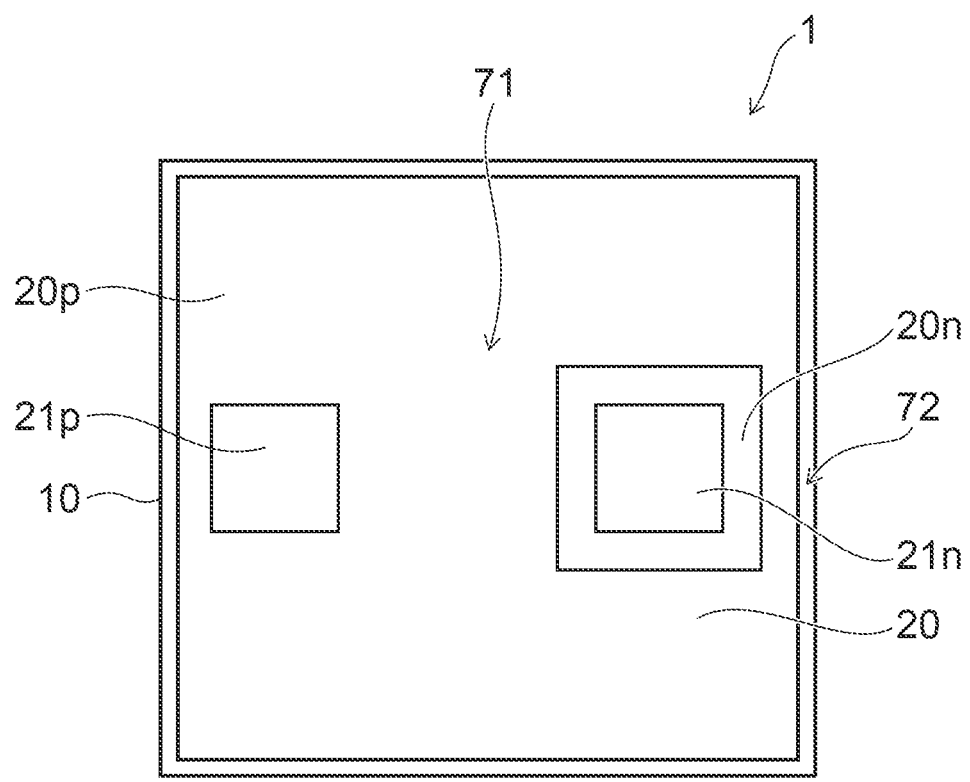
FIG. 7B is a schematic plan view of the light-emitting element according to one embodiment of the invention.

As shown in FIG. 7A, the bonded body 50 is singulated along the trench 41 and the modified regions 60 in the wafer state and is singulated into multiple light-emitting elements 1. FIG. 7B is a schematic plan view of one singulated light-emitting element 1.

As shown in FIGS. 6B and 7B, the light-emitting element 1 includes the substrate 10, the semiconductor structure 20 that is provided on the first surface 11 of the substrate 10, and the light-transmitting body 40 that includes the fluorescer and is bonded to the third surface 14 of the substrate 10.

The first surface 11 of the substrate 10 includes a first region 71 in which the multiple protrusions 13 are formed, and a second region 72 that is positioned at the outer perimeter of the first region 71 and has a smaller arithmetic average roughness than the surface of the first region 71.

The semiconductor structure 20 is provided in the first region 71, and the second region 72 is exposed from under the semiconductor structure 20. Also, the first surface 11 of the substrate 10 includes a level difference between the first region 71 and the second region 72.

A portion of the light emitted by the light-emitting layer 20a passes through the substrate 10, enters the light-transmitting body 40, and excites the fluorescer in the light-transmitting body 40. In the light-emitting element 1 of the embodiment, the color of the light obtained is a mixture of the color of the light of the light-emitting layer 20a and the color of the light emitted by the fluorescer. In the light-emitting element 1 of the embodiment, light is externally extracted mainly from the surface of the light-transmitting body 40 on the side opposite to the bonding surface with the substrate 10. The protrusions 13 of the desired heights exist at the interface between the substrate 10 and the semiconductor structure 20 in the region in which the light-emitting portion 31 is formed; therefore, the incidence efficiency of the light from the semiconductor structure 20 on the substrate 10 can be increased, and the light extraction efficiency of the light-emitting element 1 can be increased.

A method for manufacturing a light-emitting element of another embodiment of the invention will now be described with reference to FIGS. 8A to 10B.

Figure 8A:
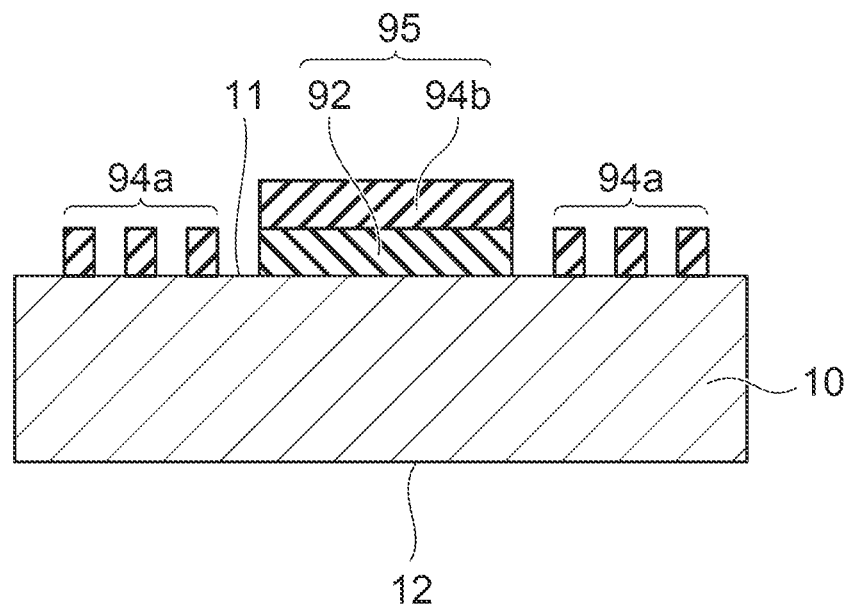
FIG. 8A and FIG. 8B are schematic cross-sectional views showing a method for manufacturing a light-emitting element according to another embodiment of the invention.

As shown in FIG. 8A, masks 94a and 95 are selectively formed at the first surface 11 of the substrate 10. The mask 95 covers a region of the first surface 11 in which the protrusions are not formed. The mask 94a covers a portion of the region of the first surface 11 in which the protrusions are formed. The first surface 11 is etched in this state. In the region of the first surface 11 in which the protrusions are formed, the mask 94a is provided to correspond to the region in which the protrusions 13 are formed. The thickness of the mask 95 in the region of the first surface 11 in which the protrusions are not formed is greater than the thickness of the mask 94a in the region of the first surface 11 in which the protrusions are formed. In the region of the first surface 11 in which the protrusions are not formed, the mask 95 has a stacked structure in which an insulating film 92 and a resist film 94b are stacked from the first surface 11 side. The insulating film 92 includes, for example, silicon oxide, silicon nitride, etc. The mask 94a is a resist film. The etching rate of the insulating film 92 for the etchant that etches the first surface 11 is less than those of the mask 94a and the resist film 94b, which are resist films.

Figure 8B:
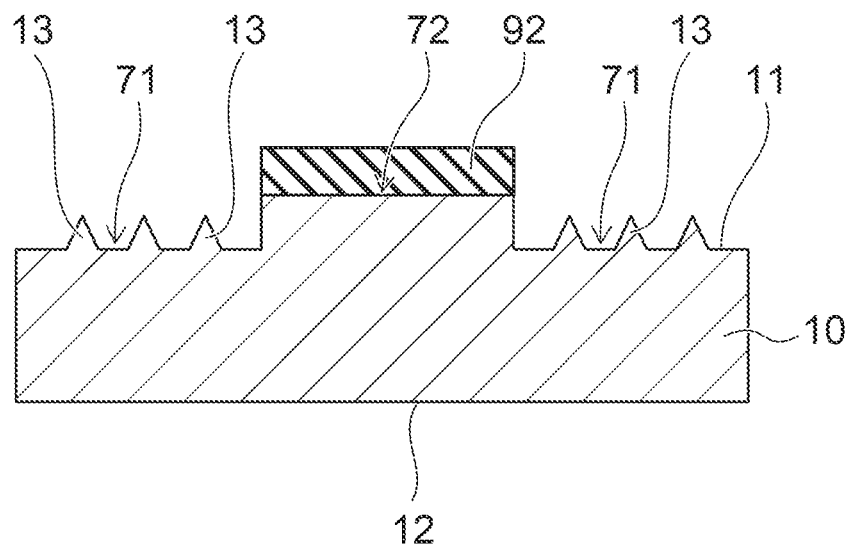

By etching the first surface 11 by using the masks 94a and 95 as shown in FIG. 8B, the multiple protrusions 13 are formed in the first region 71 of the first surface 11 that is not covered with the masks 94a and 95. The portion of the first surface 11 that is not covered with the mask 94a is etched in the first region 71, while the mask 94a is etched in the portion of the first surface 11 that is covered with the mask 94a. The first region 71 in which the multiple protrusions 13 are provided is formed by such etching. Although the resist film 94b is etched in the second region 72 of the first surface 11 covered with the mask 95, protrusions are not formed because the insulating film 92 remains. Accordingly, in the first surface 11, the first region 71 that includes the multiple protrusions 13 is formed, and the second region 72 that does not include the protrusions 13 and has a smaller arithmetic average roughness than the surface of the first region 71 is formed. The insulating film 92 that remains in the second region 72 is removed by etching, etc., and the surface of the second region 72 is exposed.

The first surface 11 in the first region 71 that is etched recedes further toward the second surface 12 side than the first surface 11 in the second region 72. Accordingly, a level difference is formed between the first surface 11 in the first region 71 and the first surface 11 in the second region 72.

Figure 9:
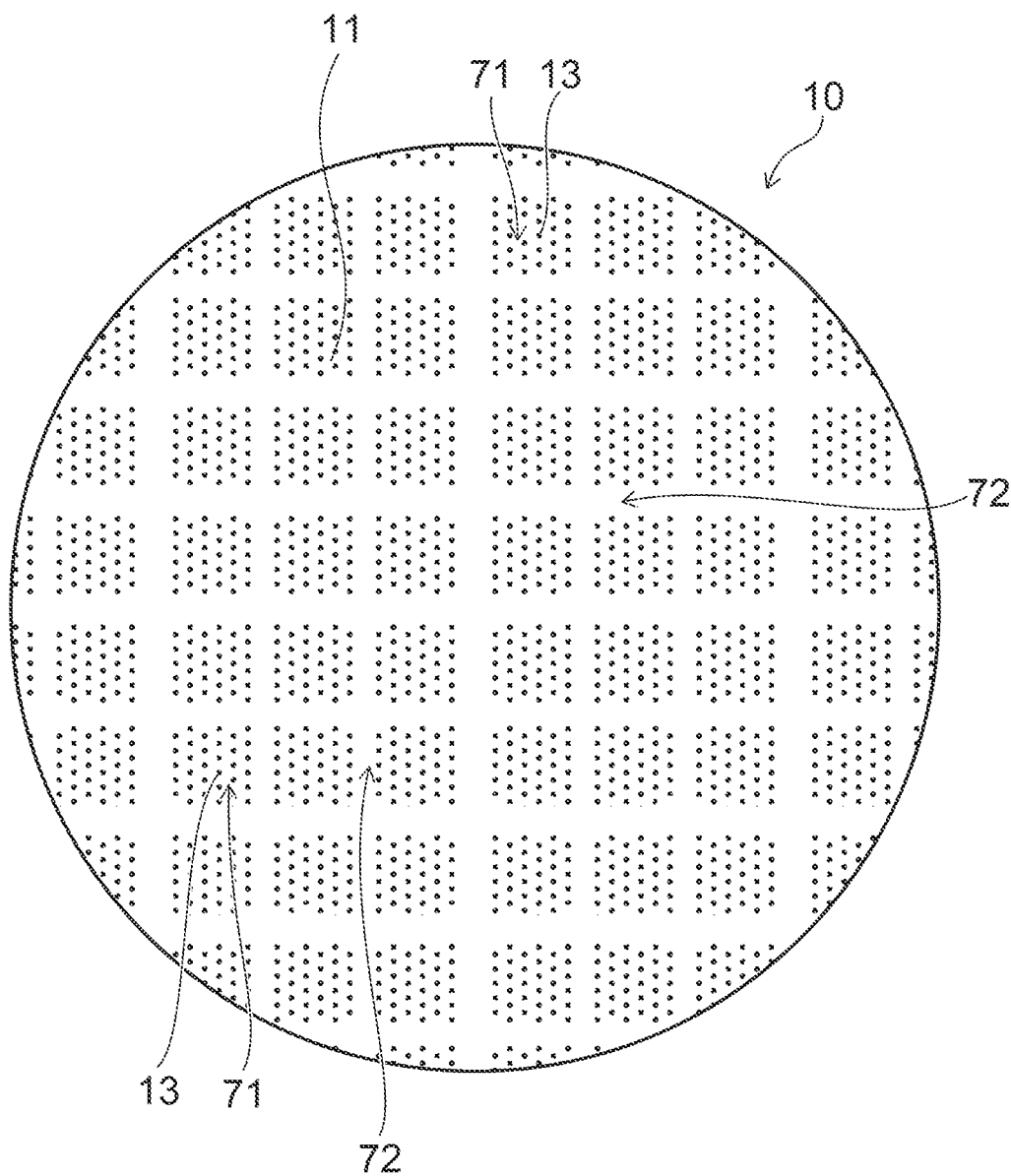
FIG. 9 is a schematic plan view showing the method for manufacturing the light-emitting element according to another embodiment of the invention.

FIG. 9 is a top view of the first surface 11 of the substrate 10 in which the first region 71 and the second region 72 are formed.

As shown in FIG. 9, the multiple second regions 72 are formed in a street configuration orthogonal to each other in a plane parallel to the first surface 11. The multiple first regions 71 in which the protrusions 13 are formed are divided by the second regions 72. The width of the second region 72 is, for example, not less than 10 μm and not more than 100 μm.

Figure 10A:
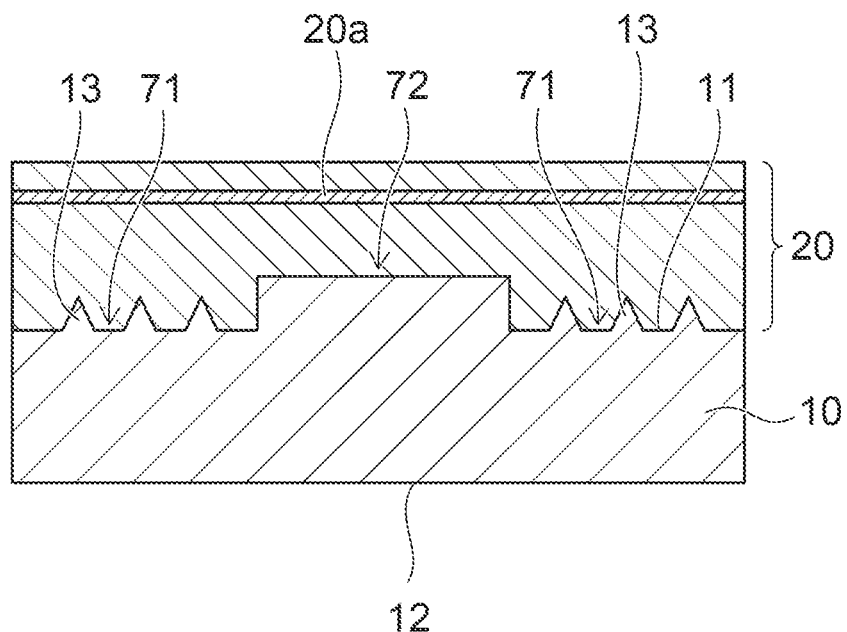
FIG. 10A and FIG. 10B are schematic cross-sectional views showing the method for manufacturing the light-emitting element according to another embodiment of the invention.

As shown in FIG. 10A, the semiconductor structure 20 is formed on the first surface 11 of the substrate 10. The semiconductor structure 20 is epitaxially grown by MOCVD on the first surface 11 including the first region 71 and the second region 72.

Figure 10B:
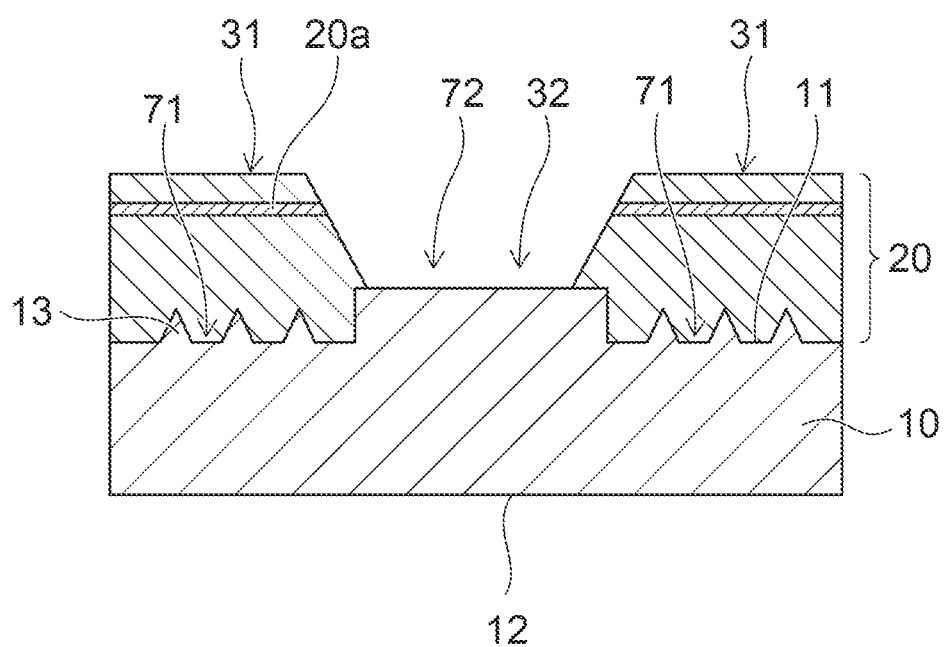

Subsequently, similarly to the embodiments described above, the semiconductor structure 20 is etched in a state in which the upper surface of the semiconductor structure 20 is selectively covered with a mask. Specifically, a mask that covers the upper surface of the semiconductor structure 20 that overlaps the first region 71 in a plan view is formed on the upper surface of the semiconductor structure 20. Thereby, as shown in FIG. 10B, a portion of the semiconductor structure 20 on the second region 72 is removed, and the exposed region 32 is formed in which the first surface 11 in the second region 72 is exposed from under the semiconductor structure 20. The exposed region 32 divides the semiconductor structure 20 into the multiple light-emitting portions 31.

Subsequently, the process of FIG. 3B and subsequent processes are continued as described above. Protrusions are not formed in the first surface 11 in the exposed region 32 on which the laser beam is irradiated. Therefore, the scattering of the laser beam in the exposed region 32 is suppressed, and the modified regions 60 can be formed inside the substrate 10 by efficiently concentrating the laser beam. In the embodiment, the laser beam can be more efficiently concentrated inside the substrate 10 because the exposed region 32 is not patterned and is a flat surface.

A method for manufacturing a light-emitting element of another embodiment of the invention will now be described with reference to FIGS. 11A to 12B.

Figure 11A:
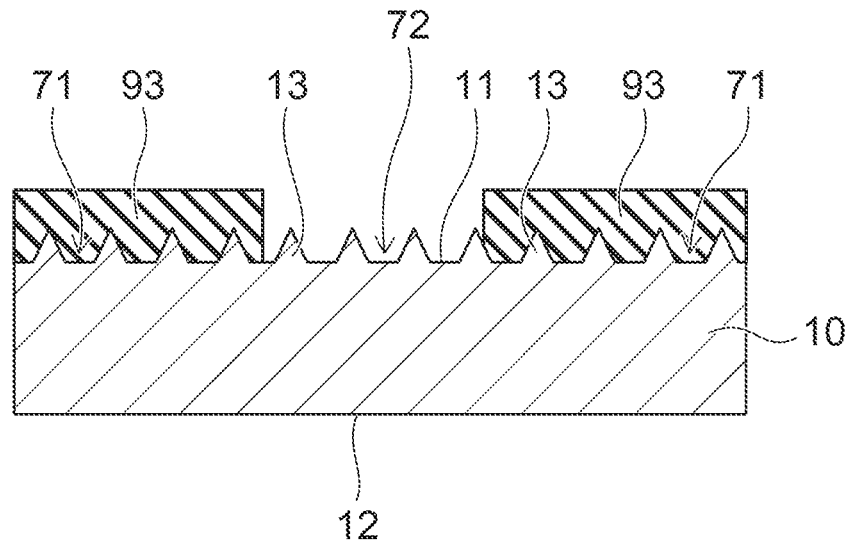
FIG. 11A to FIG. 12B are schematic cross-sectional views showing a method for manufacturing a light-emitting element according to still another embodiment of the invention.

As shown in FIG. 11A, the multiple protrusions 13 are formed in the entire surface of the first surface 11 of the substrate 10. Then, a mask 93 is selectively formed on the first surface 11. The mask 93 covers the first region 71 of the first surface 11 but does not cover the second region 72 of the first surface 11.

Figure 11B:
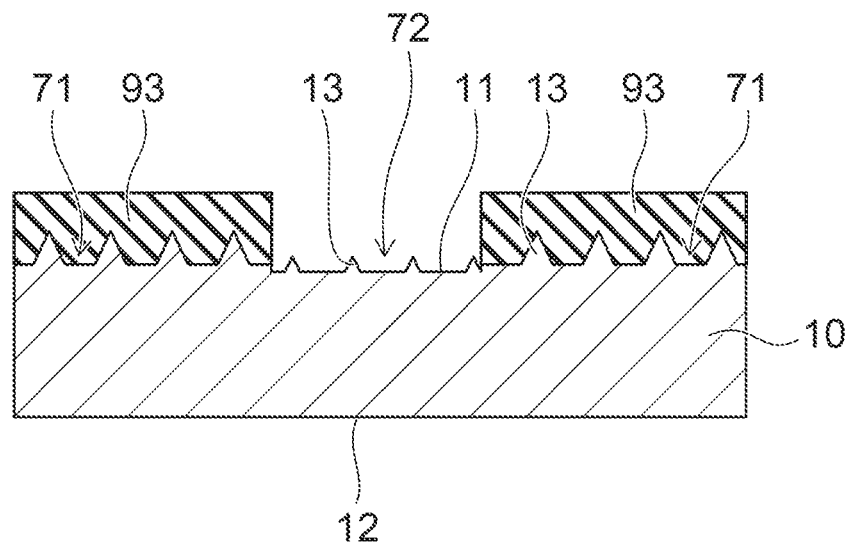

Then, the protrusions 13 that are provided in the second region 72 that is not covered with the mask 93 are etched. As shown in FIG. 11B, the heights of the protrusions 13 of the second region 72 are caused to be less than the heights of the protrusions 13 of the first region 71 by the etching using the mask 93. Also, the spacing between two adjacent protrusions 13 in the second region 72 is greater than the spacing between two adjacent protrusions 13 in the first region 71. Alternatively, the protrusions 13 of the second region 72 may be completely consumed. Thereby, the arithmetic average roughness of the first surface 11 in the second region 72 is caused to be less than the arithmetic average roughness of the first surface 11 in the first region 71.

Not only the protrusions 13 but also the first surface 11 in the second region 72 is etched, and the first surface 11 in the second region 72 recedes further toward the second surface 12 side than the first surface 11 in the first region 71. Accordingly, a level difference is formed between the first surface 11 in the first region 71 and the first surface 11 in the second region 72.

Figure 12A:
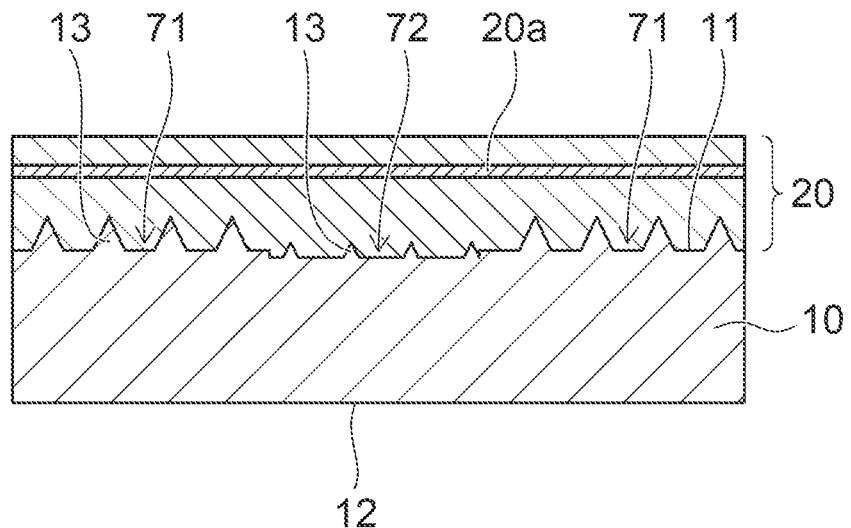

After etching the protrusions 13 of the second region 72, the semiconductor structure 20 is formed on the first surface 11 of the substrate 10 as shown in FIG. 12A. The semiconductor structure 20 is epitaxially grown by MOCVD on the first and second regions 71 and 72.

Figure 12B:
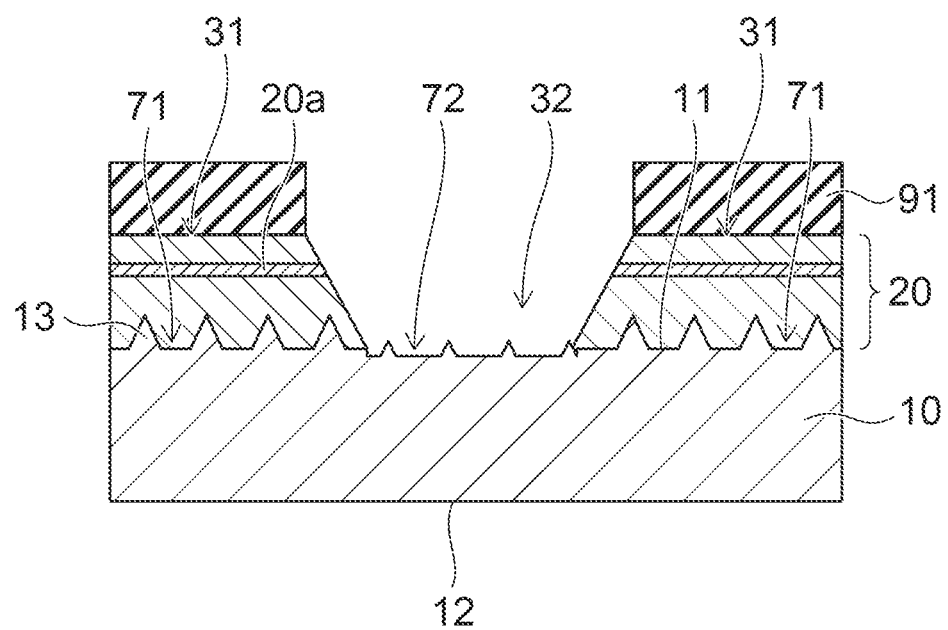

Subsequently, similarly to the embodiments described above, the semiconductor structure 20 is etched in a state in which the upper surface of the semiconductor structure 20 is selectively covered with a mask. Specifically, a mask that covers the upper surface of the semiconductor structure 20 that overlaps the first region 71 in a plan view is formed on the upper surface of the semiconductor structure 20. Thereby, as shown in FIG. 12B, a portion of the semiconductor structure 20 on the second region 72 is removed, and the exposed region 32 is formed in which the first surface 11 in the second region 72 is exposed from under the semiconductor structure 20. The exposed region 32 divides the semiconductor structure 20 into the multiple light-emitting portions 31.

Subsequently, the process of FIG. 3B and subsequent processes are continued as described above. In the embodiment as well, the arithmetic average roughness of the first surface 11 in the exposed region 32 on which the laser beam is irradiated is less than the arithmetic average roughness of the first surface 11 in the first region 71 in which the light-emitting portion 31 is formed. Therefore, the scattering of the laser beam in the exposed region 32 is suppressed, and the modified regions 60 can be formed by efficiently concentrating the laser beam inside the substrate 10.

Embodiments of the present invention have been described with reference to specific examples. However, the present invention is not limited to these specific examples. Based on the above-described embodiments of the present invention, all embodiments that can be implemented with appropriately design modification by one skilled in the art are also within the scope of the present invention as long as the gist of the present invention is included. Further, within the scope of the spirit of the present invention, one skilled in the art can conceive various modifications, and the modifications fall within the scope of the present invention.

What is claimed is:

1. A method for manufacturing a light-emitting element, the method comprising:
  forming a semiconductor structure comprising a light-emitting layer on a first surface of a substrate, wherein the first surface comprises a plurality of protrusions;
  dividing the semiconductor structure into a plurality of light-emitting portions by removing a portion of the semiconductor structure so as to form an exposed region of the substrate, wherein the first surface is exposed from under the semiconductor structure in the exposed region;
  etching the protrusions formed in the exposed region;
  bonding a light-transmitting body to a second surface of the substrate that is opposite the first surface so as to form a bonded body, wherein the light-transmitting body comprises a fluorescer;
  after the step of bonding the light-transmitting body to the second surface, forming a plurality of modified regions along the exposed region inside the substrate by irradiating a laser beam on the exposed region from a first surface side;
  after the step of forming the plurality of modified regions, removing a portion of the light-transmitting body that overlaps the plurality of modified regions in a plan view; and
  singulating the bonded body along the modified regions.

2. The method according to claim 1, further comprising:
  before the step of bonding the light-transmitting body to the second surface, thinning the substrate from a second surface side.

3. The method according to claim 2, wherein:
  in the step of thinning the substrate, a thickness of the substrate is caused to be 50 μm or less.

4. The method according to claim 2, wherein:
  the forming of the plurality of modified regions inside the substrate comprises producing a crack in a thickness direction of the substrate that reaches the first and second surfaces from the modified regions.

5. The method according to claim 3, wherein:
  the forming of the plurality of modified regions inside the substrate comprises producing a crack in a thickness direction of the substrate that reaches the first and second surfaces from the modified regions.

6. The method according to claim 1, wherein:
  the substrate is a sapphire substrate, and
  the semiconductor structure is formed of a nitride semiconductor layer.

7. The method according to claim 2, wherein:
  the substrate is a sapphire substrate, and
  the semiconductor structure is formed of a nitride semiconductor layer.

8. The method according to claim 4, wherein:
  the substrate is a sapphire substrate, and
  the semiconductor structure is formed of a nitride semiconductor layer.

9. The method according to claim 1, wherein:
  a width of the exposed region is not less than 10 μm and not more than 100 μm.

10. The method according to claim 2, wherein:
  a width of the exposed region is not less than 10 μm and not more than 100 μm.

11. The method according to claim 1, wherein:
  in the step of removing the portion of the light-transmitting body, a trench not reaching the substrate is formed along the multiple modified regions.

12. The method according to claim 1, further comprising:
  before the step of dividing the semiconductor structure into the plurality of light-emitting portions, forming a mask on an upper surface of the semiconductor structure;

wherein in the step of dividing the semiconductor structure into the plurality of light-emitting portions, the portion not covered the mask of the light-transmitting body is removed, and the etching of the protrusions is performed using the mask.

13. The method according to claim 1, wherein:

in the step of forming the bonded body, the light-transmitting body is directly bonded to the substrate.

14. The method according to claim 1, wherein:

in the step of etching the protrusions, the first surface in the exposed region is etched, and a level difference is formed between the first surface in a region in which the light-emitting portion is formed and the first surface in the exposed region.

* * * * *